United States Patent
Lee et al.

(10) Patent No.: US 8,821,641 B2
(45) Date of Patent: Sep. 2, 2014

(54) NOZZLE UNIT, AND APPARATUS AND METHOD FOR TREATING SUBSTRATE WITH THE SAME

(75) Inventors: Sang Gon Lee, Yongin-si (KR); Hyeong Soo Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/606,774

(22) Filed: Sep. 7, 2012

(65) Prior Publication Data

US 2013/0084391 A1    Apr. 4, 2013

(30) Foreign Application Priority Data

Sep. 30, 2011 (KR) .................. 10-2011-0099942
Nov. 18, 2011 (KR) .................. 10-2011-0121056

(51) Int. Cl.
  *B05B 1/28*  (2006.01)
  *C23C 16/455* (2006.01)
  *C23C 16/458* (2006.01)
  *H01L 21/687* (2006.01)

(52) U.S. Cl.
  CPC ....... *C23C 16/45508* (2013.01); *C23C 16/4585* (2013.01); *C23C 16/4584* (2013.01); *C23C 16/45572* (2013.01); *C23C 16/45519* (2013.01); *C23C 16/45574* (2013.01); *H01L 21/68771* (2013.01); *H01L 21/68764* (2013.01)
  USPC ....... 118/728; 118/715; 118/730; 156/345.33

(58) Field of Classification Search
  None
  See application file for complete search history.

(56) References Cited

U.S. PATENT DOCUMENTS

| 6,535,643 | B1 | 3/2003 | Hong |
| 6,994,887 | B2 * | 2/2006 | Tanaka ........................ 427/248.1 |
| 2001/0007244 | A1 | 7/2001 | Matsuse |
| 2004/0050326 | A1 * | 3/2004 | Thilderkvist et al. ......... 118/715 |

FOREIGN PATENT DOCUMENTS

| CN | 1652301 A | 8/2005 |
| JP | 09-246192 | * 9/1997 |
| JP | 2008-311507 | 12/2008 |
| KR | 10-2007-0109384 | 5/2006 |
| KR | 100996210 B1 | 11/2010 |
| KR | 10-2011-0093008 | 8/2011 |

OTHER PUBLICATIONS

Kubota, JP09-246192, English machine translation, Sep. 1997.*
Shimizu, JP2008-311507, Dec. 2008; English machine translation.*
Cricumferential—defintion, Free Dictionary, downloaded Dec. 2013.*
Office Action for corresponding Chinese Application No. 201210360861.1 dated Jun. 19, 2014.

* cited by examiner

*Primary Examiner* — Joseph Miller, Jr.
(74) *Attorney, Agent, or Firm* — Harness, Dickey & Pierce

(57) ABSTRACT

Provided is a substrate treatment apparatus. The substrate treatment apparatus includes a process chamber, a support unit disposed within the process chamber to support a substrate, and a nozzle unit disposed within the process chamber to spray gas. The nozzle unit includes a first nozzle spraying process gas, and a second nozzle spraying blocking gas onto an inner wall of the process chamber or an area adjacent to the support unit to prevent the process gas from being deposited on the inner wall of the process chamber or the support unit.

15 Claims, 13 Drawing Sheets

NOZZLE UNIT, AND APPARATUS AND METHOD FOR TREATING SUBSTRATE WITH THE SAME

CROSS-REFERENCE TO RELATED APPLICATIONS

This U.S. non-provisional patent application claims priority under 35 U.S.C. §119 of Korean Patent Application Nos. 10-2011-0099942, filed on Sep. 30, 2011, and 10-2010-0121056, filed on Nov. 18, 2011, the entire contents of which are hereby incorporated by reference.

BACKGROUND OF THE INVENTION

The present invention disclosed herein relates to a nozzle unit, and apparatus and method for treating a substrate with the same, and more particularly, to a nozzle unit for spraying a process gas which is deposited on a substrate to form a thin film, and an apparatus and method for treating a substrate with the same.

Semiconductor devices are manufactured by forming circuit patterns on a metal oxide formed on a substrate such as a silicon wafer. Here, a metal-organic chemical vapor deposition (MOCVD) method is widely used as a thin film formation method for coating the metal oxide on the substrate.

In the MOCVD method, a process gas, in which a liquid metal organic compound is evaporated and then mixed with a hydrogen compound, is supplied onto a substrate, and then the substrate is heated at a high temperature to induce thermal decomposition reaction of the process gas, thereby depositing a metal thin film on the substrate.

However, when a chamber or nozzle is exposed to a high temperature while the process gas is sprayed, a parasitic deposition phenomenon in which the process gas is deposited on a wall of the chamber or the nozzle before the process gas reaches the substrate may occur. If the parasitic deposition phenomenon occurs, impurities may be generated within the chamber, and the process gas may be nonuniformly sprayed to have a bad influence on quality of a metal oxide. As a result, yield and performance of semiconductor devices may be reduced.

PRIOR ART DOCUMENT

Patent Document

Korean Patent Application No. 10-0996210

SUMMARY OF THE INVENTION

The present invention provides an apparatus and method for treating a substrate which can prevent a parasitic deposition phenomenon from occurring, and a nozzle unit used in the apparatus for treating the substrate.

The present invention also provides an apparatus and method for treating a substrate which can form a uniform metal oxide on the substrate, and a nozzle unit used in the apparatus for treating the substrate.

Embodiments of the present invention provide substrate treatment apparatuses including: a process chamber; a support unit disposed within the process chamber to support a substrate; and a nozzle unit disposed within the process chamber to spray gas, wherein the nozzle unit includes: a first nozzle spraying process gas; and a second nozzle spraying blocking gas onto an inner wall of the process chamber or an area adjacent to the support unit to prevent the process gas from being deposited on the inner wall of the process chamber or the support unit.

In some embodiments, the first nozzle may spray the process gas in a horizontal direction, and the second nozzle may be disposed in at least one of upper and lower portions of the first nozzle to spray the blocking gas in a direction parallel to that of the process gas.

In other embodiments, the nozzle unit may include: a first inner tube in which the blocking gas is introduced; a second inner tube in which the process gas is introduced, the second inner tube surrounding the first inner tube; and an outer tube through which a cooling fluid for cooling the process gas within the second inner tube flows, the outer tube surrounding the second inner tube, wherein the first nozzle may extend from the second inner tube toward the outer tube, and the second nozzle may extend from the first inner tube toward the outer tube.

In still other embodiments, the nozzle unit may include: an inner tube in which the process gas is introduced; and an outer tube in which a cooling fluid for cooling the process gas within the inner tube flows, the outer tube surrounding the inner tube, wherein the first nozzle may extend from the inner tube toward the outer tube, and the second nozzle may be disposed outside an upper end of the outer tube and in a lower end of the outer tube.

In even other embodiments, the nozzle unit may include: an inner tube in which the process gas is introduced; and an outer tube in which a cooling fluid for cooling the process gas within the inner tube flows, the outer tube surrounding the inner tube, wherein the first nozzle may extend from the inner tube toward the outer tube, and the second nozzle may include a circular tube disposed along a circumference direction of an inner side surface of the outer tube and in which the blocking gas is introduced and spray holes defined in the outer tube and connected to the circular tube.

In yet other embodiments, the support unit may include: a support plate in which a plurality of holder grooves for receiving a substrate holder are defined along a circumference direction in an edge area of a top surface thereof, the support plate having a plate shape; and a rotation driving member rotating the support plate.

In further embodiments, the nozzle unit may be disposed above a central area of the support plate, and the first and second nozzles may be provided in plurality to form a radial gas flow in which the gas flows from the central area of the support plate toward an edge area.

In still further embodiments, a second groove may be defined in the central area of the top surface of the support plate, and a lower end of the nozzle unit may be inserted into the second groove so that the lower end of the nozzle unit is spaced from a bottom surface of the second groove.

In other embodiments of the present invention, nozzle units include a nozzle body in which nozzles are disposed along a circumference direction thereof, the nozzle body having a cylindrical shape, wherein the nozzles include: first nozzles spraying process gas in a horizontal direction; and second nozzles disposed in upper or lower ends of the first nozzles to spray blocking gas in a horizontal direction parallel to that of the process gas In some embodiments, the second nozzles may be classified into a first group disposed in upper ends of the first nozzles and a second group disposed in lower ends of the first nozzles, and the second nozzles belonging to the same group may be provided along a circumference direction of the nozzle body at the same height of the nozzle body.

In other embodiments, the second nozzles belonging to the first group may spray the blocking gas onto an area adjacent to an upper wall of a process chamber in which the nozzle unit is installed, and the second nozzles belonging to the second group may spray the blocking gas onto an area adjacent to a support plate on which substrates are placed.

In still other embodiments, the nozzle body may include: a first inner tube in which the blocking gas is introduced; a second inner tube in which the process gas is introduced, the second inner tube surrounding the first inner tube; and an outer tube in which a cooling fluid for cooling the process gas within the second inner tube flows, the outer tube surrounding the second inner tube, wherein the first nozzles may spray the process gas within the second inner tube to the outside of the outer tube, and the second nozzles may spray the blocking gas within the first inner tube to the outside of the outer tube.

In even other embodiments, the nozzle body may include: an inner tube in which the process gas is introduced; and an outer tube in which a cooling fluid for cooling the process gas within the inner tube flows, the outer tube surrounding the inner tube, wherein the first nozzles may spray the process gas within the inner tube to the outside of the outer tube, and the second nozzles may be provided outside of an upper end of the outer tube and in a lower end of the outer tube.

In yet other embodiments, the nozzle body may include: an inner tube in which the process gas is introduced; and an outer tube in which a cooling fluid for cooling the process gas within the inner tube flows, the outer tube surrounding the inner tube, wherein the first nozzles may spray the process gas within the inner tube to the outside of the outer tube, and the second nozzles may include a circular tube disposed along a circumference direction of an inner side surface of the outer tube and in which the blocking gas is introduced and spray holes defined in the outer tube and connected to the circular tube.

In still other embodiments of the present invention, substrate treatment methods include: loading a substrate into a processing chamber; heating the substrate; and spraying process gas onto the substrate, wherein the spraying of the process gas onto the substrate includes spraying blocking gas so that the process gas is not deposited on an inner wall of the processing chamber or a support plate on which the substrate is seated.

In some embodiments, the blocking gas may be sprayed before or after the process gas is sprayed or the blocking gas and the process gas may be sprayed at the same time.

In other embodiments, the substrate may be provided in plurality, and the plurality of substrates may be seated along a circumference direction on an edge area of the support plate, the process gas may be radially sprayed through first nozzles of a nozzle unit disposed in an upper portion of the processing chamber corresponding to a center of the support plate, and the blocking gas may be horizontally sprayed through second nozzles between the first nozzles and an upper wall of the processing chamber or between the first nozzles and the support plate.

In still other embodiments, the process gas may be sprayed through the first nozzles after the process gas is cooled by a cooling fluid.

In even other embodiments, the blocking gas may be sprayed through the second nozzles after the blocking gas is cooled by a cooling fluid.

In yet other embodiments, the support plate may be rotated around a self-rotating axis, and each of the plurality of substrates may be rotated around a self-rotating axis.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings.

DETAILED DESCRIPTION OF PREFERRED EMBODIMENTS

It will be understood that although specific terms are used and drawings are attached herein to easily describe the exemplary embodiments of the present invention, the present invention is not limited by these terms and the attached drawings.

Among technologies used in the present invention, detailed description of well-known technologies which are not closely related with the idea of the present invention will be omitted.

Preferred embodiments of the present invention are provided so that this disclosure will be thorough and complete, and will fully convey the scope of the present invention to those skilled in the art. The present invention may, however, be embodied in different forms and should not be constructed as limited to the embodiments set forth herein. Thus, it will be apparent to those skilled in the art that various modifications and variations can be made in the present invention without departing form the spirit or scope of the invention.

Hereinafter, a substrate treatment apparatus 1000 according to the present invention will be described.

The substrate treatment apparatus 1000 deposits a thin film on a substrate S using a metal organic chemical vapor deposition (MOCVD) method. Here, the substrate S may include all of substrates used for manufacturing semiconductor devices or liquid crystal displays (LCDs) in comprehensive concepts. For example, the substrate S may include sapphire ($Al_2O_3$) substrates used for manufacturing epi wafers and silicon wafers used for manufacturing silicon carbide (SIC) substrates or semiconductor integrated circuits.

Hereinafter, the substrate treatment apparatus 1000 according to an embodiment of the present invention will be described.

Figure 1:
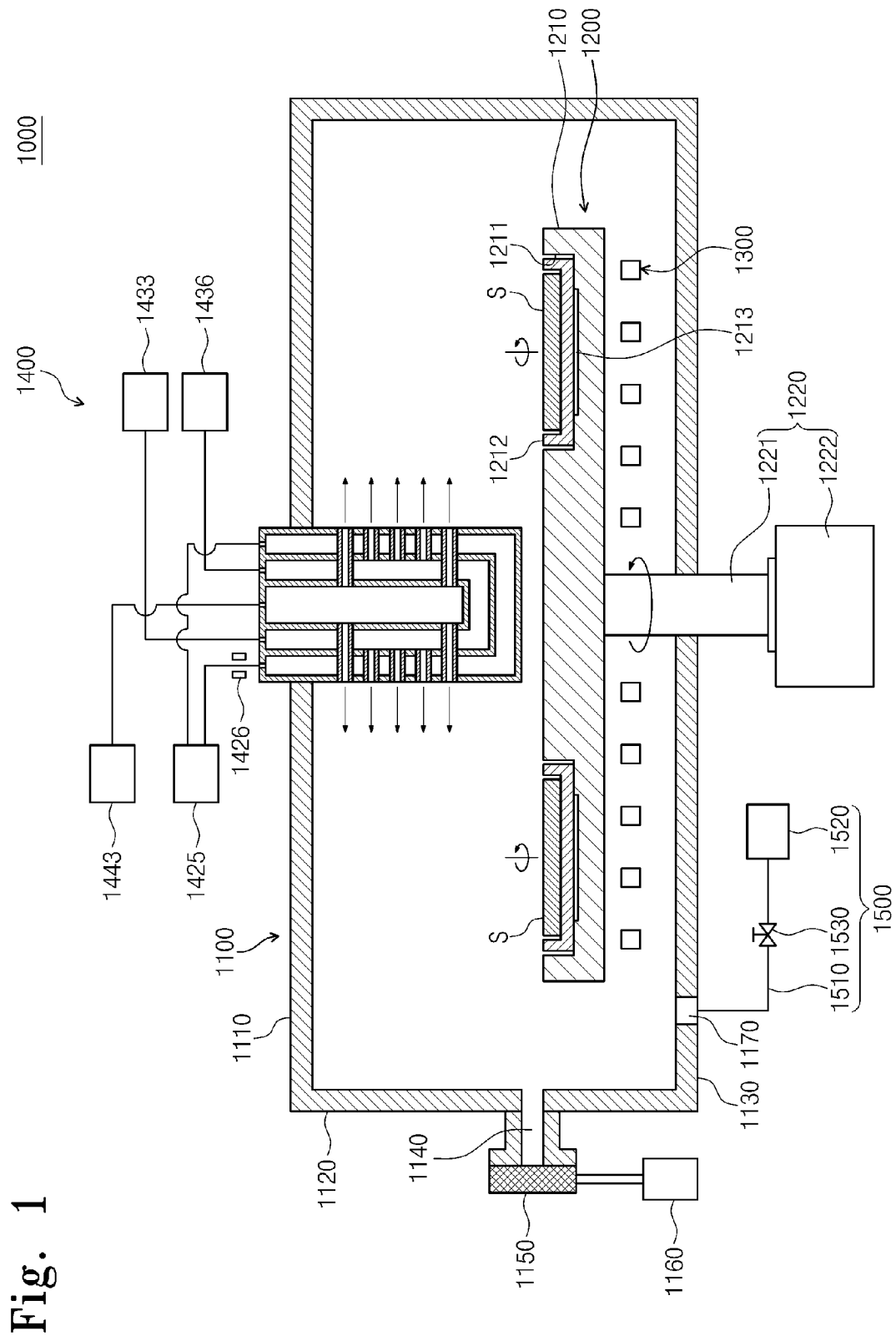
FIG. 1 is a cross-sectional view of a substrate treatment apparatus according to an embodiment of the present invention.

FIG. 1 is a cross-sectional view of the substrate treatment apparatus 1000 according to an embodiment of the present invention.

The substrate treatment apparatus 1000 includes a process chamber 1100, a support unit 1200, a heating unit 1300, a nozzle unit 1400, and an exhaust unit 1500.

The process chamber 1100 provides a space in which a deposition process is performed by using the MOCVD method. The substrate S is seated on the support unit 1200. The heating unit 1300 heats the substrates S. The nozzle unit 1400 sprays gas into the process chamber 1100. The exhaust unit 1500 exhausts gas from the process chamber 1100.

The process chamber 1100 includes walls 1110, 1120, and 1130 for isolating the inside of the process chamber 1100 from the outside. The walls 1110, 1120, and 1130 include an upper wall 1110, a sidewall 1120 extending downward from an edge of the upper wall 1110, and a lower wall 1130 coupled to a lower end of the sidewall 1120 to face the upper wall 1110.

Each of the upper and lower wells 1110 and 1130 may have a circular plate shape.

A passage 1140 through which the substrate S loaded or unloaded is defined in the sidewall 1120. A door 1150 for opening or closing the passage 1140 is installed in the passage 1140. The door 1150 may be moved in a direction perpendicular to a length direction of the passage 1140 by an operation of an elevator 1160 coupled to the door 1150 to open or close the passage 1140.

The support unit 1200 is disposed within the process chamber 1100. The support unit 1200 includes a support plate 1210 and a rotation driving member 1220. The substrate S is seated on the support plate 1210, and the rotation driving member 1220 rotates the support plate 1210.

Figure 2:
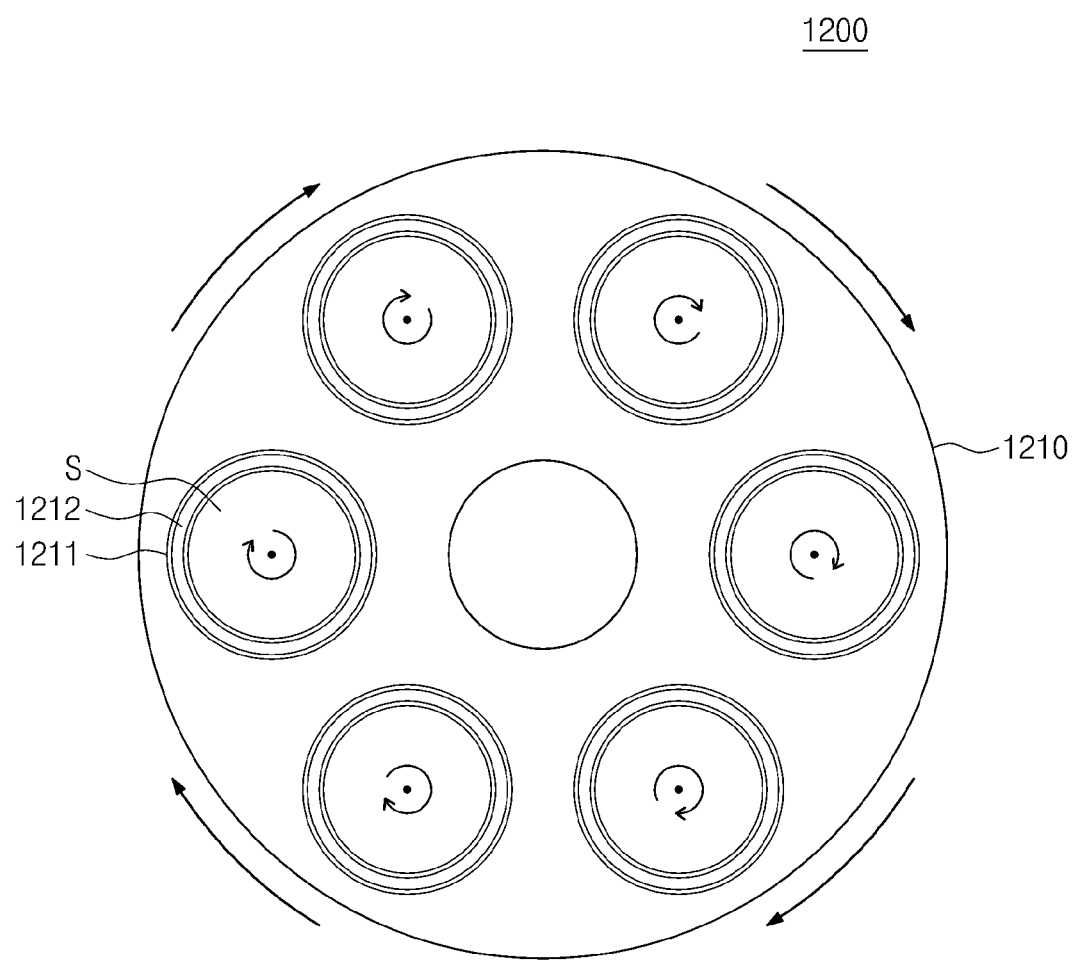
FIG. 2 is a plan view of a support unit of FIG. 1.

FIG. 2 is a plan view of a support unit 1200 of FIG. 1.

The support plate 1210 may have a circular plate shape. The support plate 1210 may be formed of a material having high electrical conductivity. For example, the support plate 1210 may be formed of graphite.

A plurality of holder grooves 1211 are defined along an edge of a top surface of the support plate 1210. The hole grooves 1211 may be defined in the same circumference from a center of the support plate 1210.

Although the support plate 1210 has six holder grooves 1211 at a distance of about 60 degrees in the current embodiment, the number of the holder grooves may vary according to a size of the support plate 1210, a size of the substrate S, and an arrangement structure of the holder grooves 1211. Also, the disposition or configuration of the holder grooves 1211 may be different from those of the above-described embodiment.

A holder 1212 is inserted into each of the holder grooves 1211. The substrate S is seated on the holder 1212. One substrate or plurality of substrates may be seated on one holder. The holder 1212 has an outer diameter less than a diameter of each of the holder grooves 1211 and an inner diameter greater than a diameter of the substrate S. The holder 1212 has a cylindrical shape with an opened upper side. The holder 1212 may be formed of a material having high electrical conductivity. For example, the holder 1211 may be formed of graphite.

The holder 1212 is rotated around a self-rotating axis by a principle of a gas bearing.

A rotation groove 1213 having a spiral shape is defined in a bottom surface of each of the holder grooves 1211. Rotation gas is supplied from a gas supply member (not shown) into the rotation groove 1213. The supplied rotation gas flows along the rotation groove 1213 to transmit a rotation force into the bottom of the holder 1212, thereby rotating the holder 1212. The substrate S is rotated by the rotation of the holder 1212. The rotation gas is exhausted through a space between the holder 1212 and the holder groove 1211.

The rotation driving member 1220 rotates the support plate 1210. The rotation driving member 1220 includes a rotation shaft and a motor 1222. A driving shaft 1221 may be inserted to pass through the lower well 1130 of the process chamber 1100. The driving shaft 1221 has an upper end coupled to the bottom surface of the support plate 1210 and a lower end coupled to the motor 1222. The driving shaft 1221 may be rotated or elevated by the motor 1222. When the driving shaft 1221 is rotated or elevated by the motor 1222, the support plate 1210 is rotated or elevated by the driving shaft 1221.

The heating unit 1300 heats the substrate S seated on the support plate 1210. The heating unit 1300 may be disposed on a lower portion of the support plate 1210 or within the support plate 1210. For example, a high frequency heating unit such as a radio frequency coil may be used as the heating unit 1300. The radio frequency coil may be disposed to surround the driving shaft 1221 and receive power from an external power source to induction-heat the support plate 1210. Also, the radio frequency coil may heat the substrate S through the holder 1212 of the support plate 1210.

The nozzle unit 1400 is disposed spaced from an upper portion of a central area of the support plate 1210 to spray gas into the process chamber 1100. The nozzle unit 1400 includes a nozzle body 1410, a first nozzle 1450, and a second nozzle 1460. The first nozzle 1450 sprays process gas, and the second nozzle 1460 sprays blocking gas.

Here, gas in which a metal organic compound and a hydrogen compound are mixed may be used as the process gas. The metal organic compound may contain aluminum (Al), gallium (Ga), indium (In), etc. The hydrogen compound may contain arsene, phosphine, ammonia, etc. The first nozzle 1450 may spray carrier gas together with the process gas to help the spray of the process gas. The carrier gas may contain hydrogen $H_2$, nitrogen $N_2$, etc. For example, inert gas such as helium (H2), argon (Ne), or gas having components similar to those of the carrier gas may be used as the blocking gas.

The exhaust unit 1500 may include an exhaust line 1510, an exhaust pump 1520, and an exhaust valve 1530. The exhaust line 1510 has one end connected to an exhaust hole 1170 defined in the process chamber 1100 and the other end connected to the exhaust pump 1520.

The exhaust pump 1520 applies a negative pressure into the process chamber 1100 through the exhaust line 1510. Thus, reaction gas, the carrier gas, the blocking gas, and byproducts generated during the deposition process may be exhausted from the inside of the process chamber 1100. The exhaust pump 1520 may control an internal pressure of the process chamber 1100 through the above-described exhaust processes. For example, the internal pressure of the process chamber 1100 may be adjusted from a vacuum state up to an atmospheric pressure or a high pressure above the atmospheric pressure. The exhaust valve 1530 is installed in the exhaust line 1510 to control a flow rate of gas within the exhaust line 1510.

Figure 3:
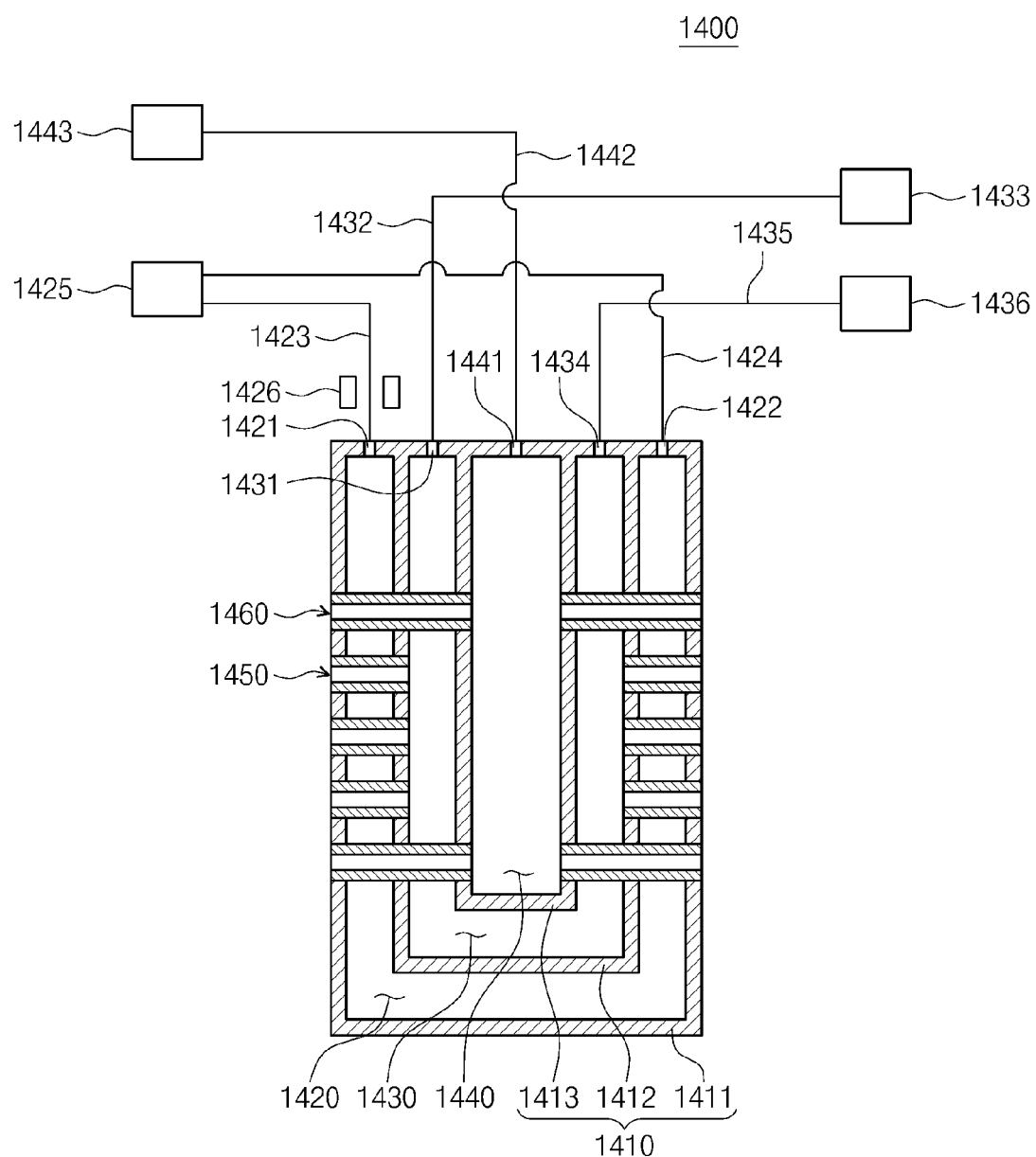
FIG. 3 is a cross-sectional view of a nozzle unit of FIG. 1.
Figure 4:
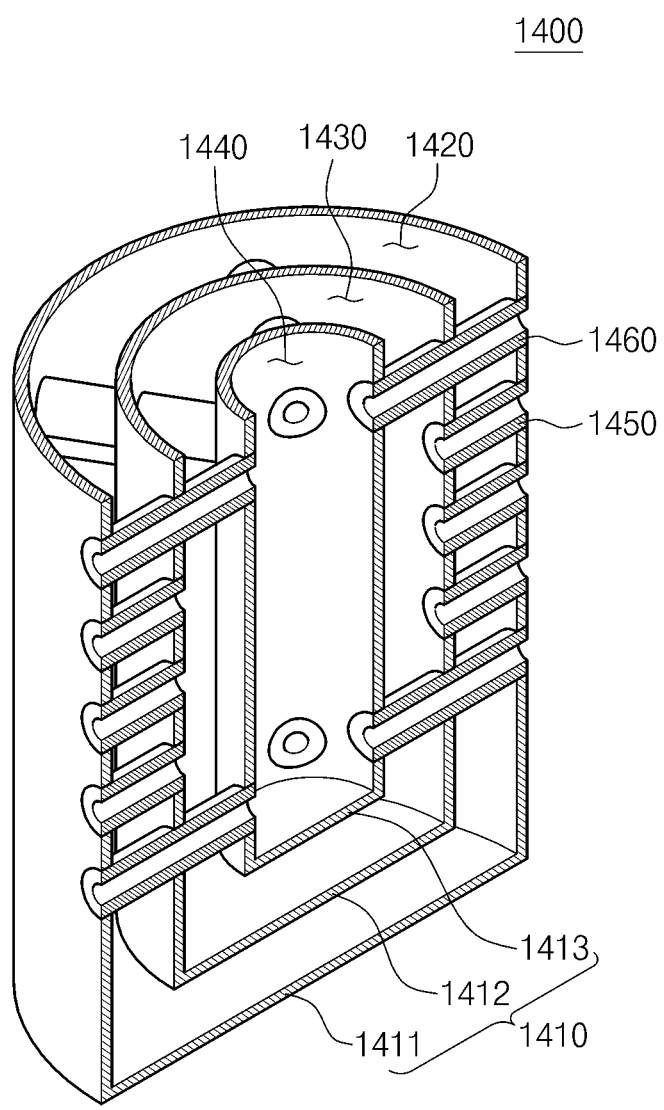
FIG. 4 is a cut-away perspective view of the nozzle unit of FIG. 1.
Figure 5:
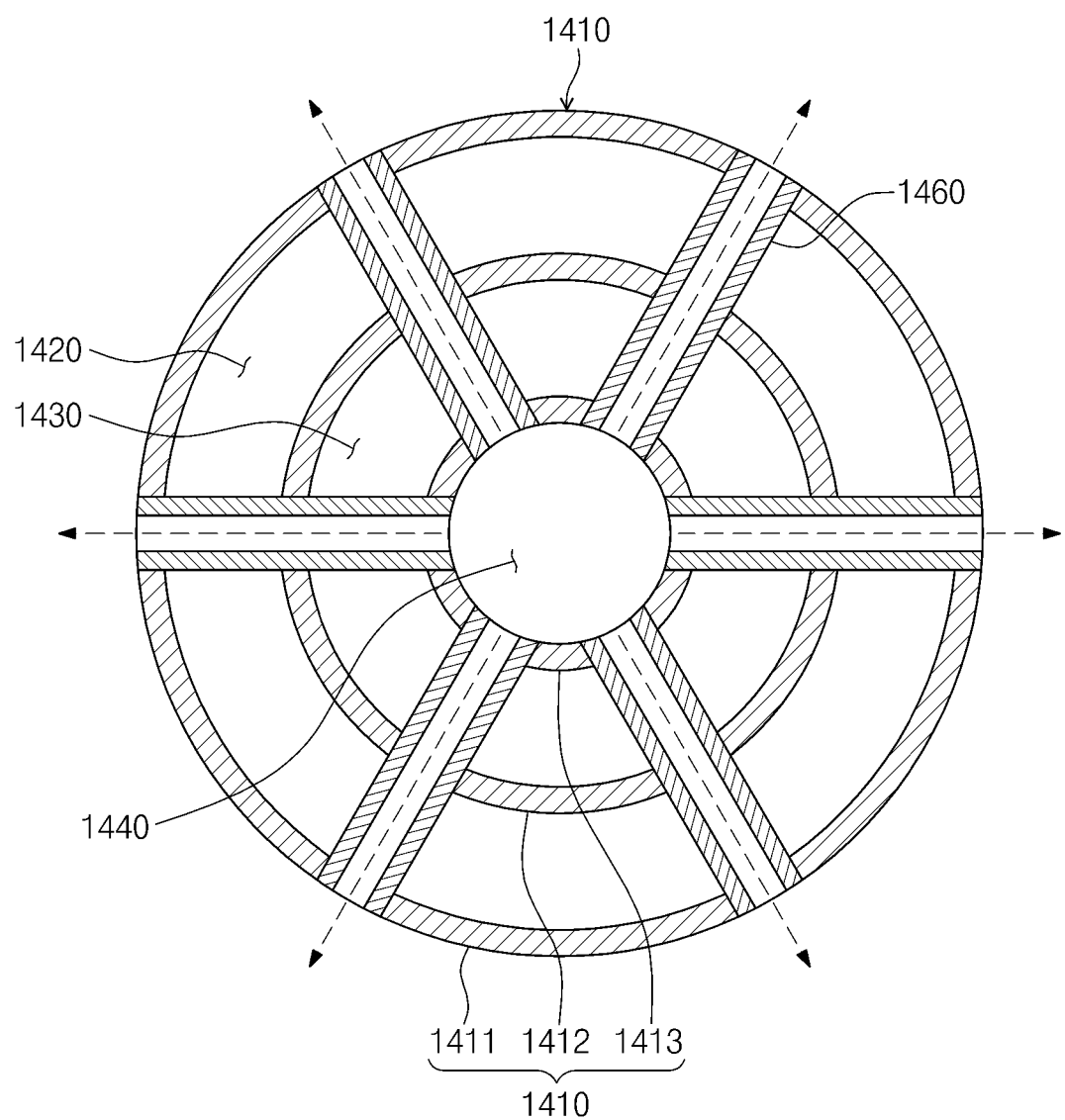
FIG. 5 is a cross-sectional view of the nozzle unit.
Figure 6:
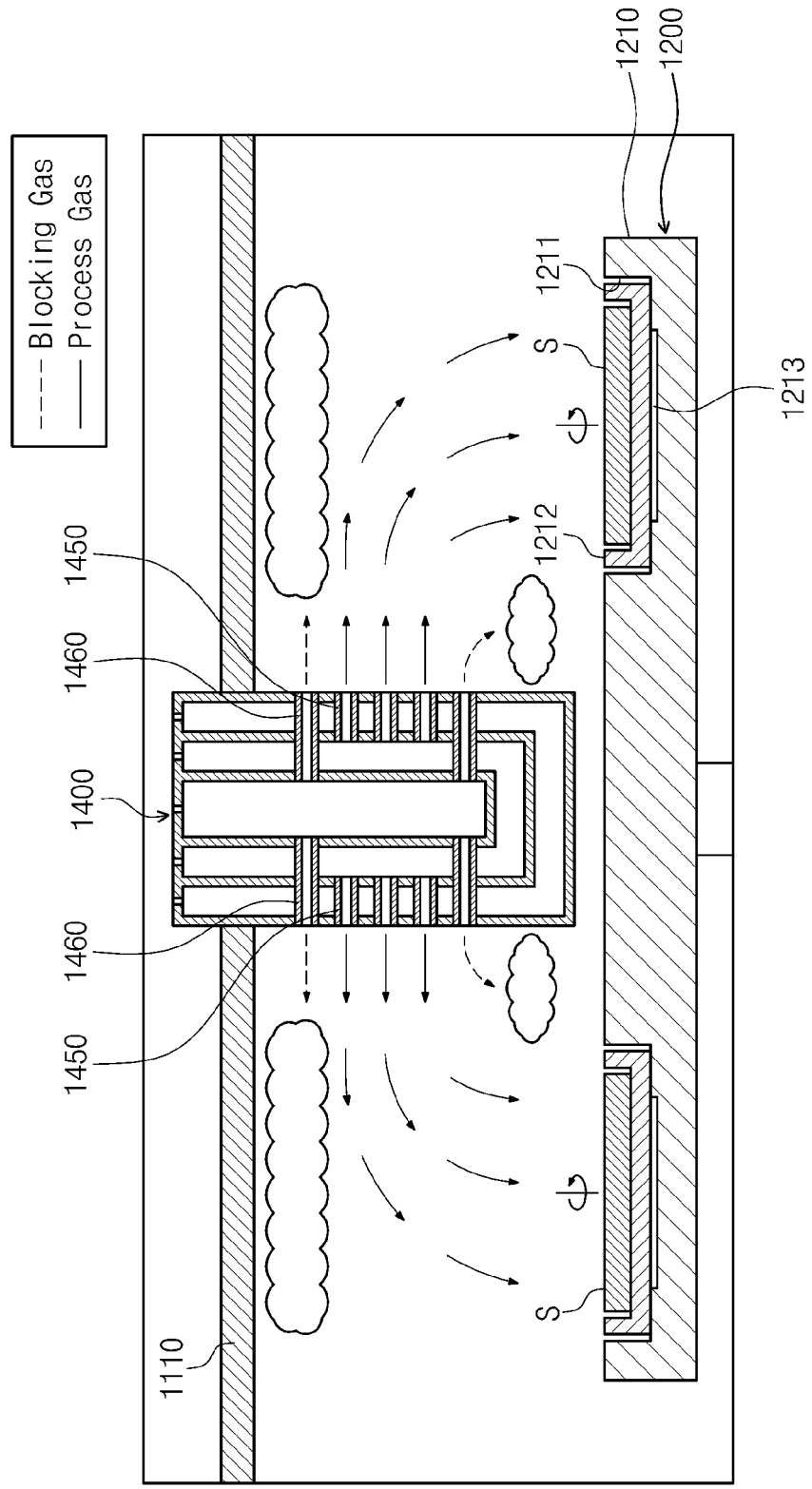
FIG. 6 is a view illustrating a flow of gas sprayed from the nozzle unit of FIG. 1.

FIG. 3 is a sectional view of the nozzle unit 1400 of FIG. 1. FIG. 4 is a cut-away perspective view of the nozzle unit 1400 of FIG. 1. FIG. 5 is a cross-sectional view of the nozzle unit 1400.

Referring to FIGS. 3 to 5, the nozzle body 1410 includes an outer tube 1411, a second inner tube 1412, and a first inner tube 1413. Each of the tubs 1411, 1412, and 1413 has a lateral surface with a vertical length direction. Also, each of the tubes 1411, 1412, and 1413 has a top surface coupled to an upper end of the lateral surface and a bottom surface coupled to a lower end of the lateral surface. The outer tube 1411 surrounds the second inner tube 1412, and the second inner tube 1412 surrounds the first inner tube 1413. The tubes 1411, 1412, and 1413 may share the top and bottom surfaces together. Each of the tubes 1411, 1412, and 1413 may have a cylindrical shape.

An external space defined between the outer tube 1411 and the second inner tube 1412, a second internal space 1430 defined between the second inner tube 1412 and the first inner tube 1413, and a first internal space defined inside the first inner tube 1413 are provided within the nozzle body 1410 by the tubes 1411, 1412, and 1413. A cooling fluid flows into the external space 1420, the reaction gas is introduced into the second internal space 1430, and the blocking gas is introduced into the first internal space 1440.

A first process gas inflow hole 1431 and a second process gas inflow hole 1434 are defined in an upper portion of the second inner tube 1412. The first process gas inflow hole 1431 is connected to a first process gas line 1432, and the first process gas line 1432 is connected to a first process gas supply source 1433 in which the metal organic compound is stored. The second process gas inflow hole 1434 is connected to a second process gas line 1435, and the second process gas line 1435 is connected to a second process gas supply source 1436 in which the hydrogen compound is stored. The metal organic compound and the hydrogen compound gases are introduced into the second internal space 1430 through the first and second process gas inflow holes 1431 and 1434. The metal organic compound and the hydrogen compound are mixed within the second internal space 1430 to generate the process gas. A carrier gas inflow hole through which the carrier gas is introduced may be further defined in an upper portion of the second inner tube 1412.

A blocking gas inflow hole 1441 is defined in an upper portion of the first inner tube 1413. The blocking gas inflow hole 1441 is connected to the blocking gas line 1442, and the blocking gas line 1442 is connected to the blocking gas supply source 1443. The blocking gas is introduced from the blocking gas supply source 1443 into the first internal space 1440 through the blocking gas line 1442 and the blocking gas inflow hole 1441.

A cooling fluid inflow hole 1421 is defined in one side of the outer tube 1411, and a cooling fluid recovery hole 1422 is defined in the other side of the outer tube 1411. The cooling fluid inflow hole 1421 is connected to a cooling fluid inflow line 1423, and the cooling fluid inflow line 1423 is connected to a cooling fluid supply source 1425. The cooling fluid recovery hole 1422 is connected to a cooling fluid recovery line 1424, and the cooling fluid recovery line 1424 is connected to the cooling fluid supply source 1425. The cooling fluid is introduced from the cooling fluid supply source 1425 into the external space 1420 through the cooling fluid inflow line 1423 and the cooling fluid inflow hole 1421. Then, the cooling fluid is recovered and circulated into the cooling fluid supply source 1425 through the cooling fluid recovery line 1424. A temperature adjustment member 1426 is installed in the cooling fluid inflow line 1423. The temperature adjustment member 1426 adjusts a temperature of the cooling fluid flowing into the cooling fluid inflow line 1423 to adjust a temperature of the cooling fluid inflowing into the external space 1420. Inert gas such as water ($H_2O$) or nitrogen gas may be used as the cooling fluid.

The first nozzle 1450 extends from the second inner tube 1412 to the outer tube 1411 so that a length direction thereof is oriented in a horizontal direction. The first nozzle 1450 may be provided in plurality along a circumference direction of the second inner tube 1412. Also, the first nozzle 1450 may be provided in plurality, and the plurality of first nozzles 1450 may be vertically spaced apart from each other within the second inner tube 1412. Also, the first nozzle 1450 may be provided in a plurality of sets. The plurality of sets of the first nozzles 1450 provided along a circumference direction by combining the above-described arrangement may be provided vertically or horizontally spaced apart from each other. Thus, the process gas may be sprayed into the process chamber 1100 from the second internal space 1430 through the first nozzles 450.

The second nozzle 1460 sprays the blocking gas onto inner walls of the process chamber 1100 or an area adjacent to the support unit 1200 to prevent the process gas sprayed through the first nozzle 1450 from being deposited on the inner walls of the process chamber 1100 or the components installed within the process chamber 1100 such as the support unit 1200.

For example, the second nozzles 1460 are classified into a first group disposed in upper portions of the first nozzles 1450 and a second group disposed in lower ends of the first nozzles 1450. The second nozzles 1460 belonging to the first group disposed in the upper portions of the first nozzles 1450 may spray the blocking gas between the first nozzle 1450 and the upper wall of the process chamber 1110. Also, the second nozzles 1460 belonging to the second group disposed in the lower ends of the first nozzles 1450 may spry the blocking gas between the first nozzle 1450 and the support unit 1200.

The second nozzle 1460 extends from the first inner tube 1413 to the outer wall 1411 to pass through the second inner tube 1412 so that a length direction of the second nozzle 1460 is horizontally parallel to the first nozzle 1450. The second nozzle 1460 may be provided in plurality along a circumference direction of the first inner tube 1413. The second nozzle 1460 may be disposed on an upper or lower portion of the first nozzle 1450 or each of both sides of the upper or lower portion. That is, one end of the second nozzle 1460 connected to the outer tube 1411 is disposed on an upper or lower portion of an end of the first nozzle 1450 connected to the outer tube 1411 or each of both sides of the upper or lower portion.

FIG. 5 is a view illustrating a flow of gas sprayed from the nozzle unit 1400 of FIG. 1. The first nozzle 1450 sprays the process gas into the process chamber 1100. The process gas is sprayed into the process chamber 1100 from the second internal space 1430 through the first nozzle 1450.

Here, since the process gas is cooled while passing through the outer tube 1420 in which the cooling fluid flows through the first nozzle 1450, the first nozzle 1450 sprays the cooled process gas. Since the cooled process gas has low reactivity, the cooled process gas is not deposited onto the process chamber 1100, the support plate 1210, and the ends of the nozzles before the cooled process gas reaches the substrate S to primarily prevent a parasitic deposition phenomenon from occurring.

The second nozzle 1460 sprays the blocking gas onto the inner walls of the process chamber 1100 or the area adjacent to the support unit 1200 to prevent the process gas sprayed through the first nozzle 1450 from being deposited on the inner walls of the process chamber 1100 or the components installed within the process chamber 1100 such as the support unit 1200. Thus, the blocking gas is exhausted toward upper and lower sides into which the process gas is exhausted through the second nozzle 1460. The blocking gas exhausted toward the upper side of the process gas prevents the process gas from reaching the upper wall 1110 of the process chamber 1100, and the blocking gas exhausted toward the lower side of the process gas prevents the process gas from reaching the support unit 1200. Thus, it may prevent the parasitic deposition phenomenon from occurring.

Hereinafter, a substrate treatment method using the substrate treatment apparatus 1000 according to the present invention will be described. However, since this is merely an example for easy explanation, the substrate treatment method may be performed using the other apparatus similar to the substrate treatment apparatus 1000 according to the present invention.

Figure 7:
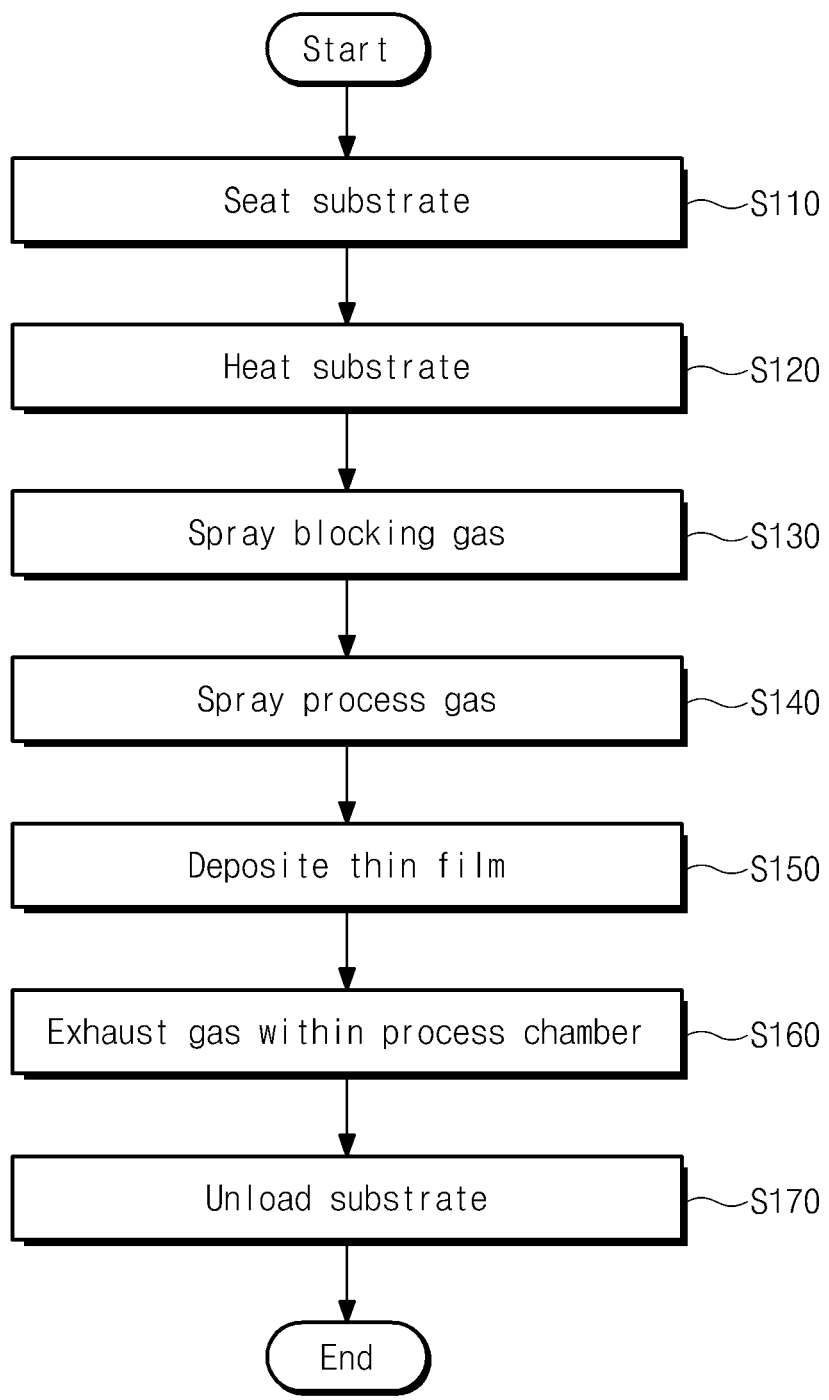
FIG. 7 is a flowchart of a substrate treatment method according to an embodiment of the present invention.

Hereinafter, the substrate treatment method according to an embodiment of the present invention will be described. FIG. 7 is a flowchart of a substrate treatment method according to an embodiment of the present invention.

The substrate treatment method according to an embodiment may include seating a substrate S (S110), heating the substrate S (S120), spraying blocking gas (S130), spraying process gas (S140), depositing a thin film (S150), exhausting gas within a process chamber 1100 (S160), and unloading the substrate S (S170).

In operation S110, the substrate S is seated on a support unit 1200. The substrate S is loaded into the process chamber 1100 through a passage 1140 formed in a sidewall 1120 of the process chamber 1100, and the loaded substrate S is placed on a holder 1212 of a support plate 1210.

In operation S120, a heating unit 1300 heats the substrate S. When the substrate S is placed on the support unit 1200, the heating unit 1300 heats the support plate 1210, and thus, the substrate S is heated.

When the substrate S is heated at a temperature suitable for a deposition process, a second nozzle 1460 sprays the blocking gas in operation S130, and a first nozzle 1450 sprays the process gas in operation S140. Here, the blocking gas may be sprayed first, and then the process gas may be sprayed. Alternatively, the blocking gas and the process gas may be sprayed at the same time. Since the sprayed gas is sprayed in a cooled state by a cooling fluid, the gas is not deposited onto inner walls of the process chamber 1100 or components installed within the process chamber 1100 such as a nozzle unit 1400 and the support unit 1200. Also, since the blocking gas prevents the process gas from being moved toward the inner walls of the process chamber 1100 or the components installed within the process chamber 1100, a parasitic deposition phenomenon may be more effectively prevented.

In operation S150, the sprayed process gas is provided onto the substrate S to form the thin film on the substrate S. When the process gas is provided onto the substrate S, the process gas adheres to a top surface of the substrate S due to a temperature of the heated substrate S to form a thin film formed of metal oxide. Here, since the substrate S is rotated by the holder 1212, the process gas may be uniformly distributed on the substrate S to uniformly form the thin film. A metal organic chemical vapor deposition (MOCVD) method is performed according to the above-described processes.

When the metal oxide is formed on the substrate S, an exhaust unit 1500 exhausts the gas within the process unit in operation S160. When the exhaust of the gas is completed, the substrate S is unloaded to the outside through the passage 1140 formed in the sidewall 1120 of the process chamber 1100 in operation S170, and then, the deposition process is finished.

Figure 8:
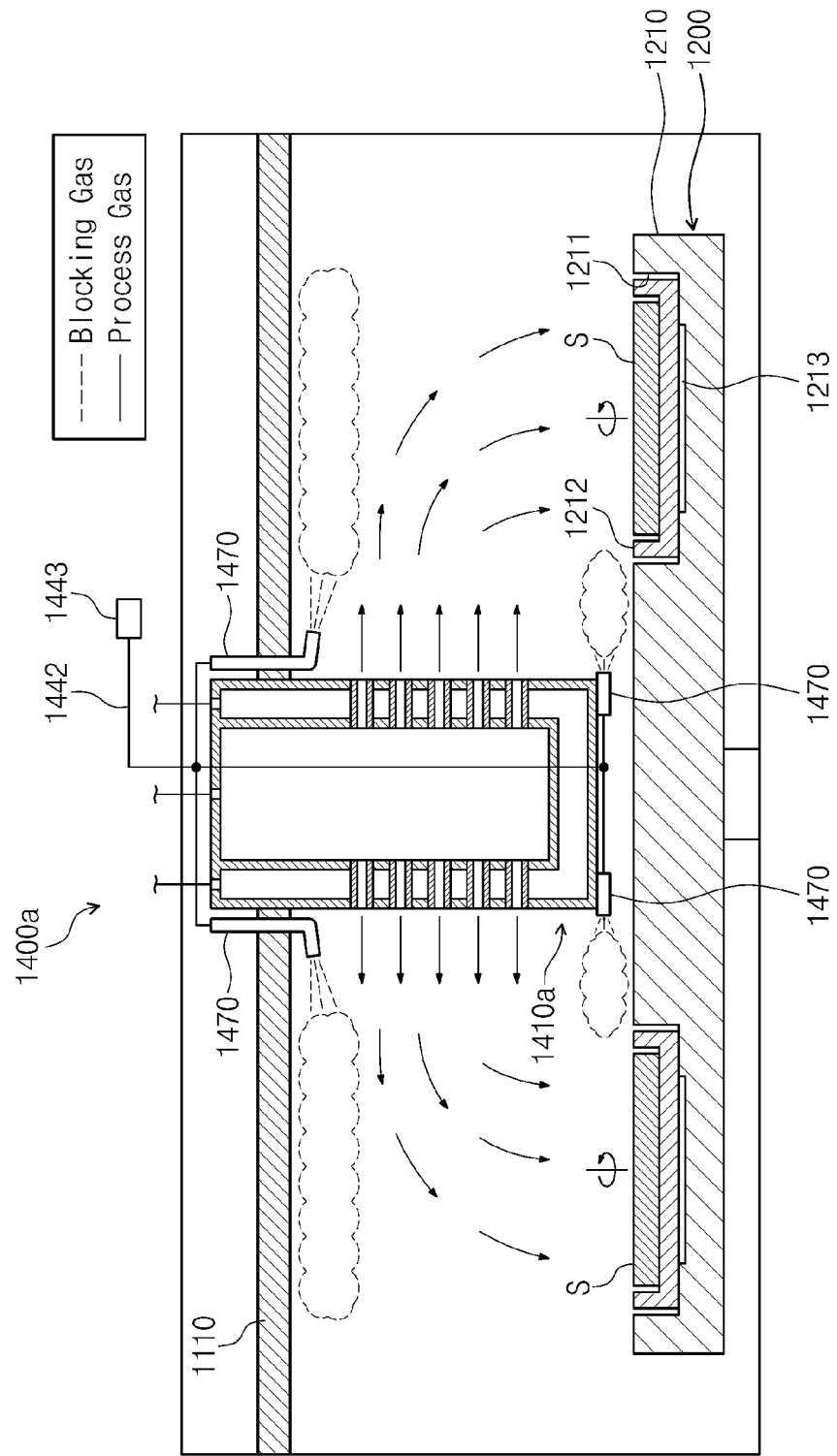
FIG. 8 is a view of a nozzle unit according to anther embodiment of the present invention.

FIG. 8 is a view of a nozzle unit according to anther embodiment of the present invention.

A nozzle unit 1400a of FIG. 8 may include second nozzles 1470 provided as separate components outside a nozzle body 1410a. The nozzle body 1410a has a dual tube structure constituted by an outer tube 1411 and an inner tube 1412. The outer tube 1411 may surround the inner tube 1412. Also, top and bottom surfaces of the outer and inner tubes 1411 and 1412 may be shard together. Each of the outer and inner tubes 1411 and 1412 may have a cylindrical shape.

An external space 1420 defined between the outer tube 1411 and the inner tube 1412, and an internal space 1430 defined inside the inner tube 1412 are provided within the nozzle body 1410a by the tubes 1411 and 1412. A cooling fluid flows into the external space 1420, and reaction gas is introduced into the internal space 1430.

A first nozzle 1450 extends from the inner tube 1412 to the outer tube 1411 so that a length direction thereof is oriented in a horizontal direction. The process gas is sprayed into the process chamber 1100 from the internal space 1430 through the first nozzle 1450.

Second nozzles 1470 may spray blocking gas to prevent the process gas from reaching an upper wall 1110 of the process chamber 1100 or a support unit 1200. A portion of the second nozzles 1470 is installed in the upper wall 1110 to spray the blocking gas between the first nozzle 1450 and the upper wall 1110 of the process chamber 1100. Others of the second nozzles 1470 are installed in a lower end of the nozzle body 1410a. The second nozzles 1470 are installed so that the spraying direction of the blocking gas is horizontally parallel to the spraying direction of the process gas. The second nozzles 1470 may be provided in plurality along a circumference direction of the nozzle body 1410a.

Figure 9:
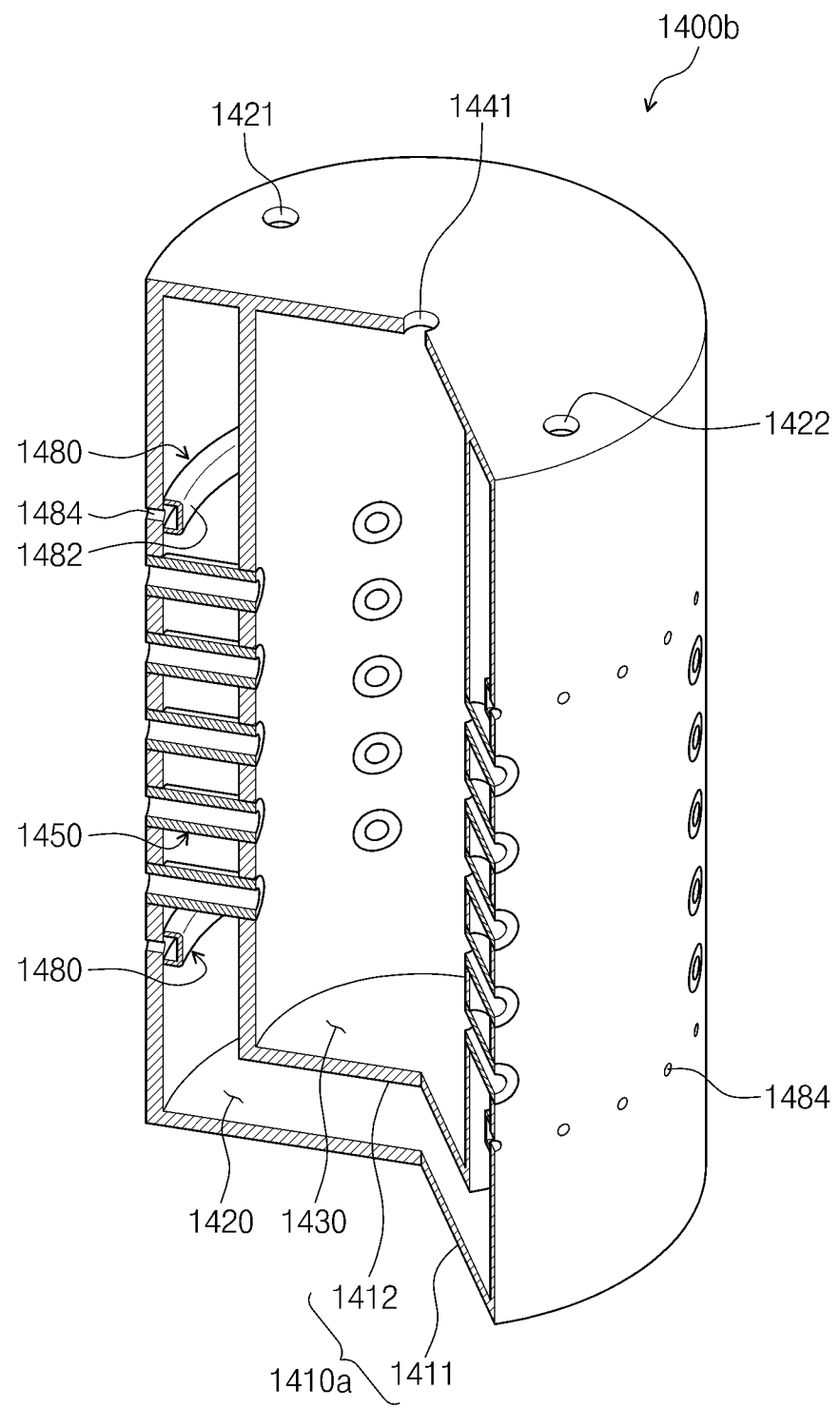
FIGS. 9 and 10 are views of a nozzle unit according to another embodiment of the present invention.
Figure 10:
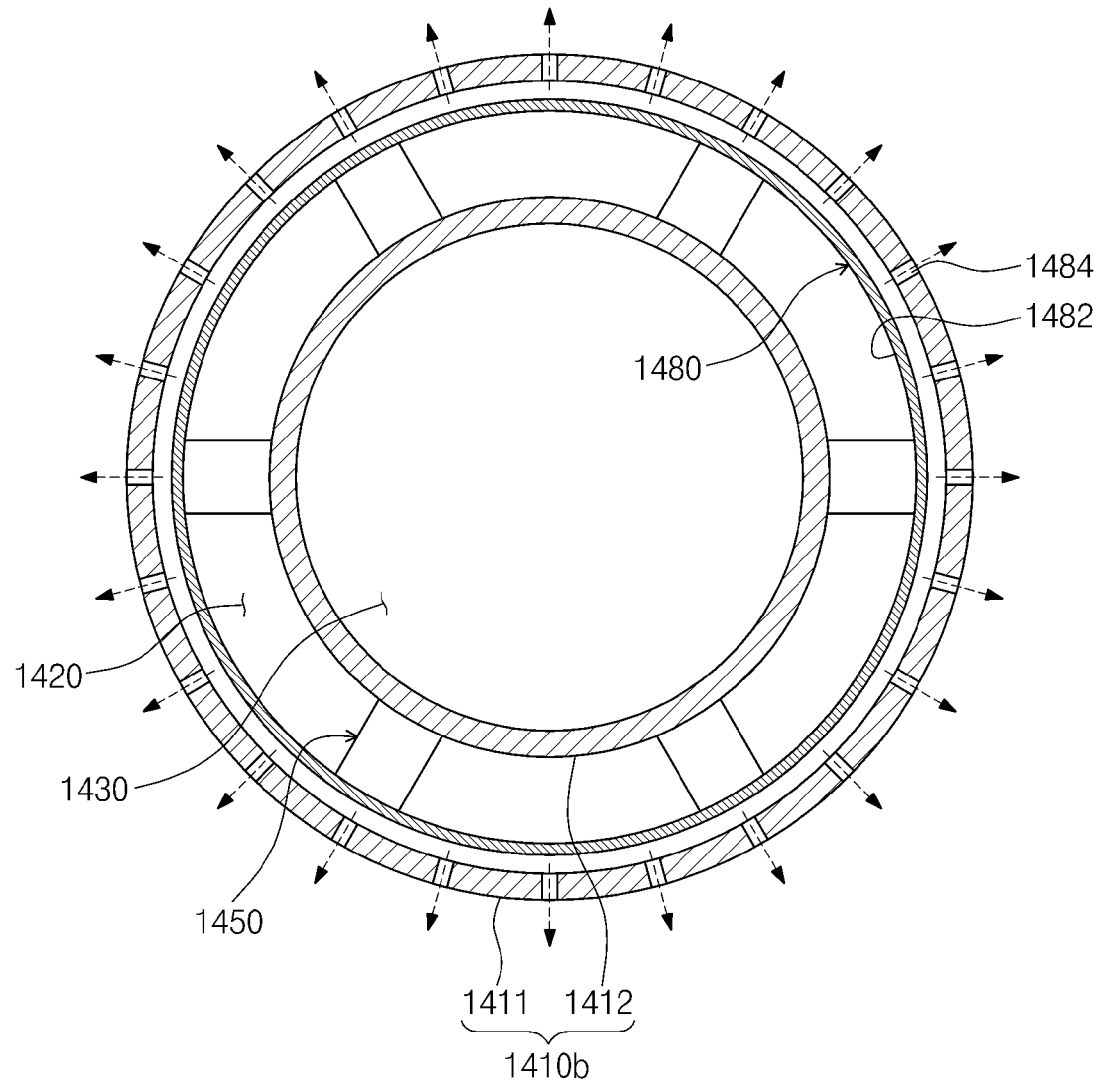

FIGS. 9 and 10 are views of a nozzle unit according to another embodiment of the present invention.

A nozzle unit 1400b illustrated in FIGS. 9 and 10 includes second nozzles 1480 for spraying blocking gas in an inner side surface of an outer tube 1411.

A nozzle body 1410b has a dual tube structure constituted by an outer tube 1411 and an inner tube 1412. The outer tube 1411 may surround the inner tube 1412. Also, top and bottom surfaces of the outer and inner tubes 1411 and 1412 may be shard together. Each of the outer and inner tubes 1411 and 1412 may have a cylindrical shape.

An external space 1420 defined between the outer tube 1411 and the inner tube 1412 and an internal space 1430 defined inside the inner tube 1412 are provided within the nozzle body 1410b by the tubes 1411 and 1412. A cooling fluid flows into the external space 1420, and reaction gas is introduced into the internal space 1430.

Each of the second nozzles 1480 includes a circular tube 1482 and a spray hole 1484. The circular tube 1482 is disposed along a circumference direction of an inner surface of the outer tube 1411. The blocking gas is introduced into the circular tube 1482. The spray holes are defined in the outer tube 1411 and connected to the circular tube 1482.

The second nozzles 1480 are installed in the outer tube 1411 so that the second nozzles 1480 are respectively disposed in upper and lower ends of the first nozzle 1450. The second nozzle 1480 disposed in the upper end of the first nozzle 1450 sprays the blocking gas onto an area adjacent to an upper wall of a process chamber. The second nozzle 1480 disposed in the lower end of the first nozzle 1450 sprays the blocking gas onto an area adjacent to a support plate on which substrates are placed.

Figure 11:
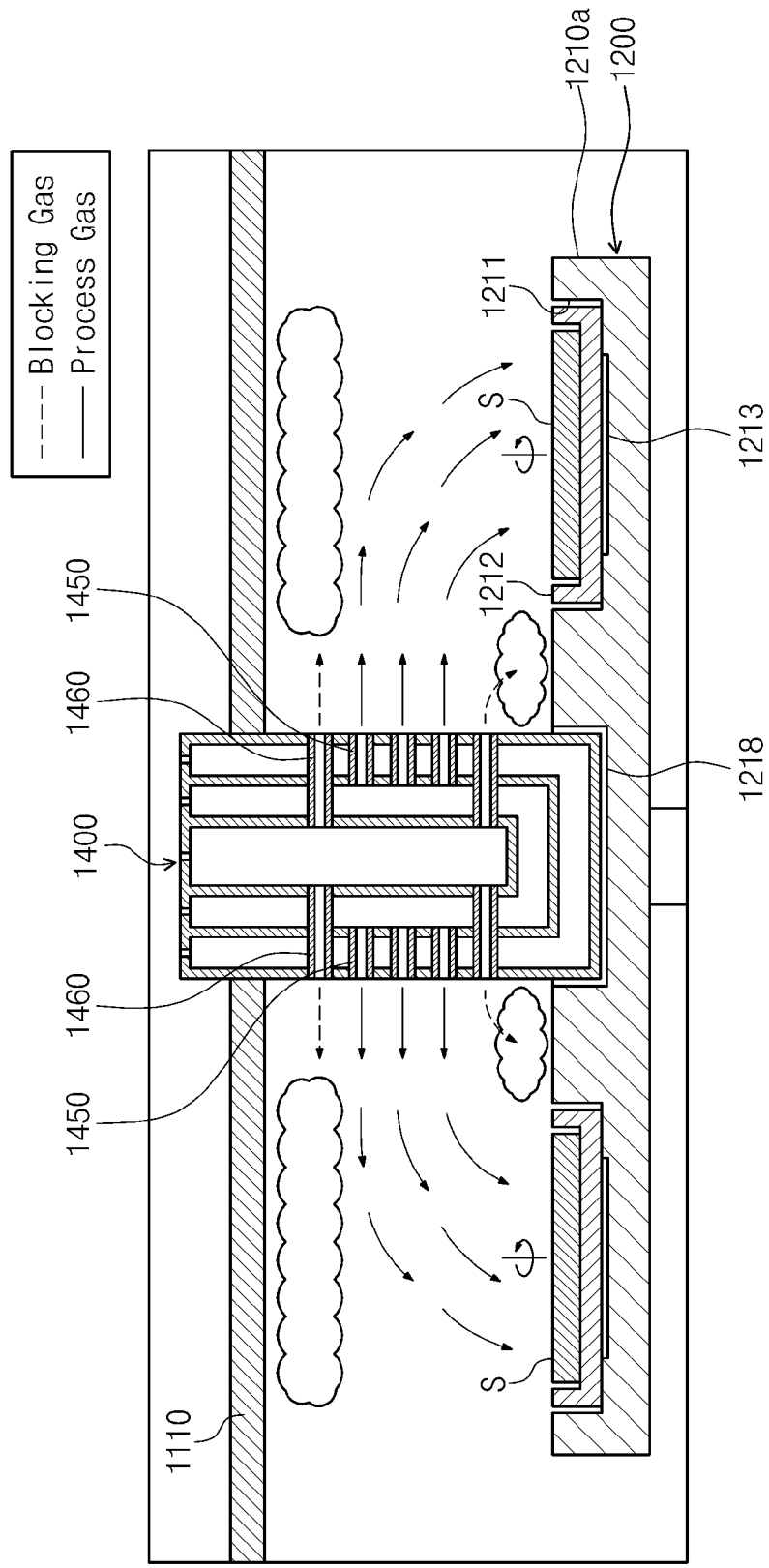
FIG. 11 is a view illustrating a modified arrangement structure of the support unit and the nozzle unit.

FIG. 11 is a view illustrating a modified arrangement structure of the support unit and the nozzle unit.

Referring to FIG. 11, a second groove 1218 is defined in a center of a top surface of a support plate 1210a. A nozzle body 1410 of the nozzle unit 1400 is inserted into the second groove 1218 so that the nozzle body 1410 is spaced from a bottom surface of the second groove 1218. Since a vertical distance between the second nozzle 1460 and the support plate 1210a is reduced by the above-described structure, it may effectively prevent the process gas from being deposited onto the support plate 1210a.

Figure 12:
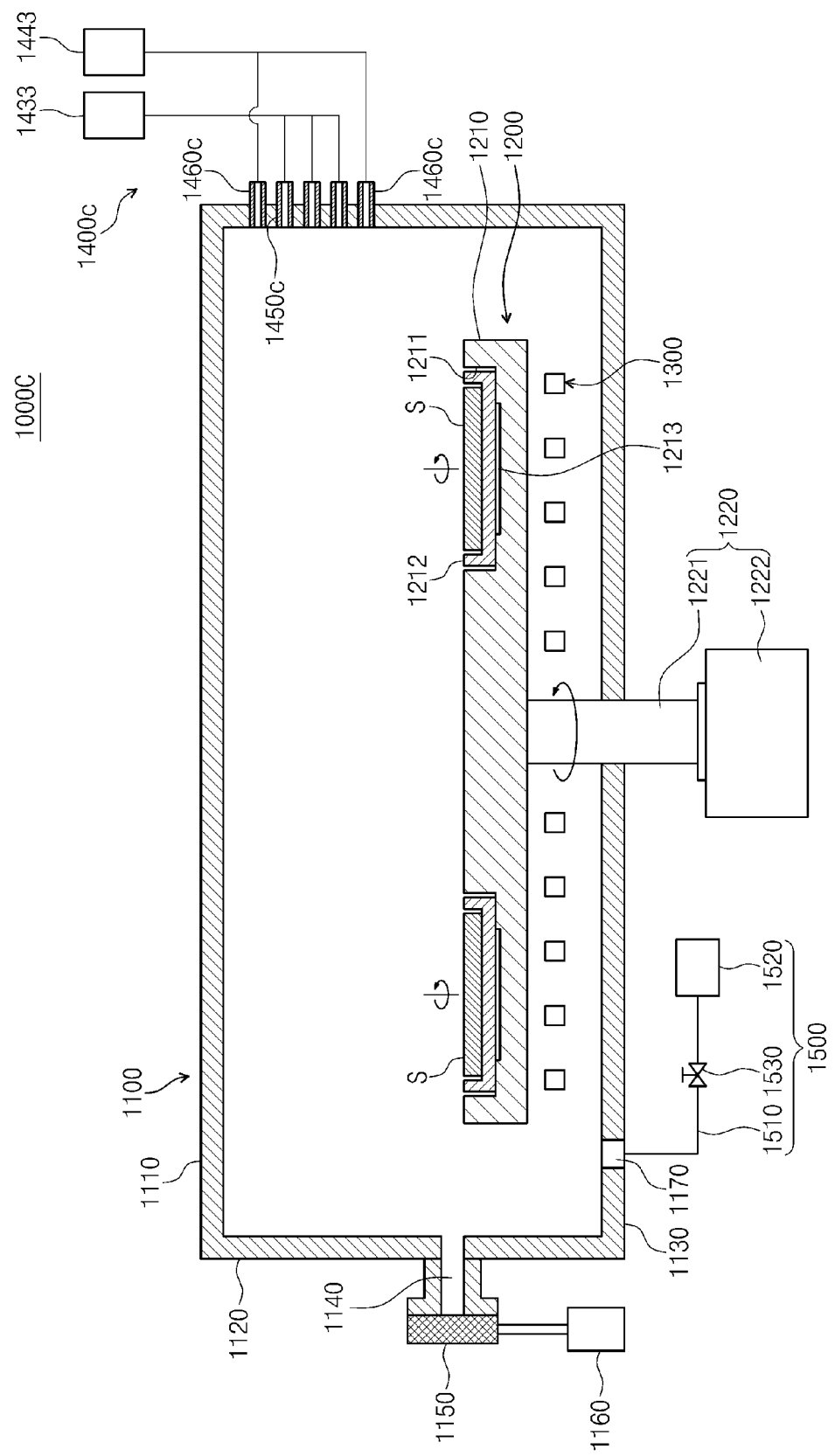
FIG. 12 is a view of a substrate treatment apparatus according to another embodiment of the present invention.
Figure 13:
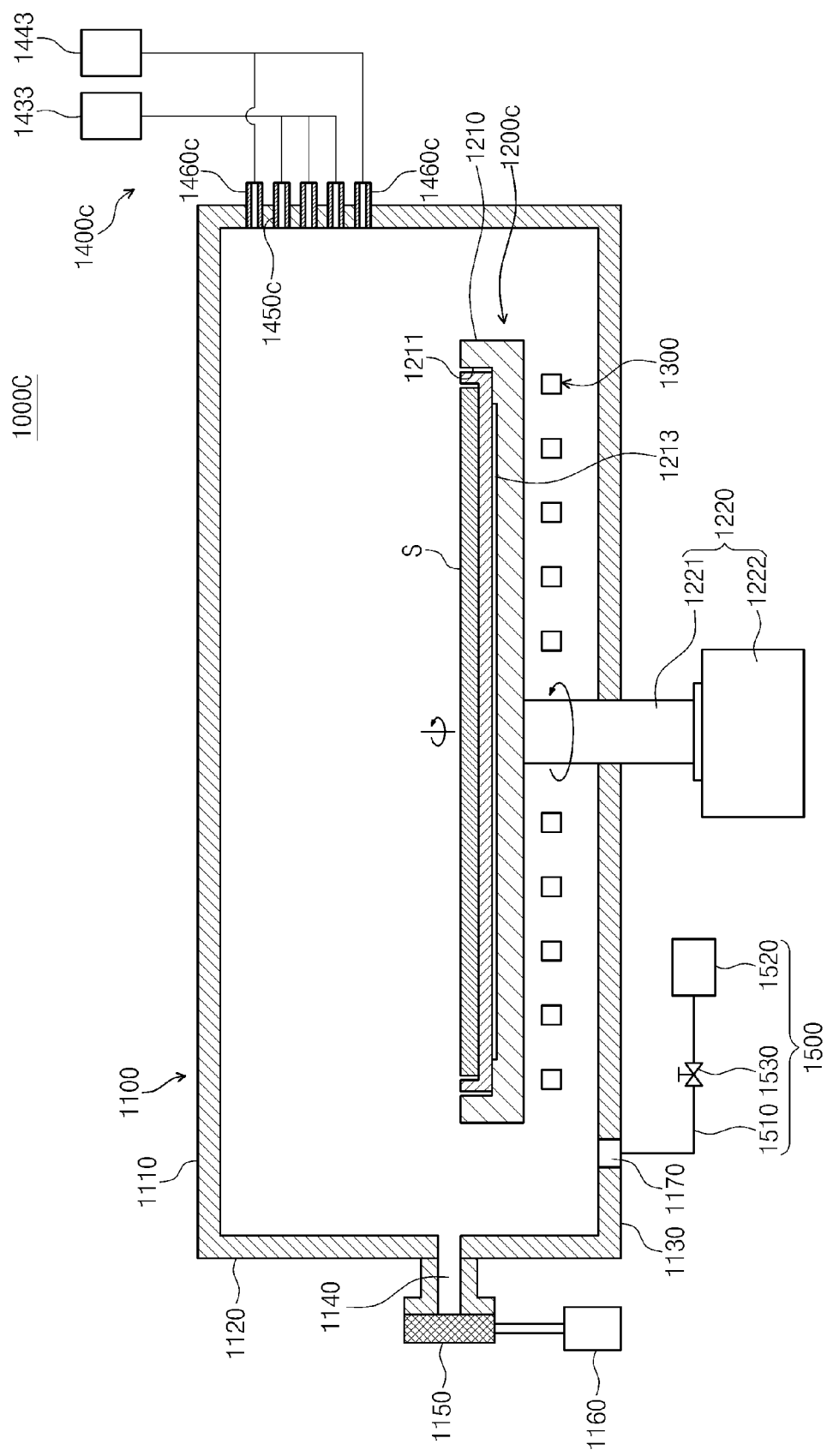
FIG. 13 is a view of a substrate treatment apparatus according to another embodiment of the present invention.

FIGS. 12 and 13 are views of a substrate treatment apparatus according to another embodiment of the present invention.

A substrate treatment apparatus 1000*c* of FIG. 12 illustrates an example of a structure in which a first nozzle 1450*c* and a second nozzle 1460*c* of a nozzle unit 1400*c* are installed in a sidewall 1120 of a process chamber 1100.

A substrate treatment apparatus 1000*c* of FIG. 13 illustrates an example of a substrate treatment process which is performed in a state where a first nozzle 1450*c* and a second nozzle 1460*c* of a nozzle unit 1400*c* are installed in a sidewall of a process chamber 1100, and one substrate is seated on a support plate 1210 of a support unit 1200*c*.

The process chamber 1100 includes walls 1110, 1120, and 1130 for isolating the inside of the process chamber 1100 from the outside. The walls 1110, 1120, and 1130 include an upper wall 1110, a sidewall 1120 extending downward from an edge of the upper wall 1110, and a lower wall 1130 coupled to a lower end of the sidewall 1120 to face the upper wall 1110.

In the current embodiment of the present invention, the apparatus for depositing the thin film on the substrate using the metal organic chemical vapor deposition (MOCVD) method is described as an example. However, the present invention is not limited thereto. For example, the present invention may be applied to various deposition apparatuses. Also, in the current embodiment of the present invention, the apparatus for depositing the thin film on the substrate is described as an example of the substrate treatment apparatus. However, the present invention is not limited thereto. For example, the present invention may be applied to various apparatuses which can perform a process such as an etching process, an ashing process, and the like by supplying gas or plasma into a chamber in which a substrate is provided.

Also, although the passage through which the cooling gas flows is formed within the nozzle unit in the current embodiment of the present invention, the passage through which the cooling gas flows may not be provided in the nozzle unit.

Also, in the current embodiment of the present invention, the second nozzles are provided in all the upper and lower portions of the first nozzle. However, the second nozzle may be disposed only the upper portion of the first nozzle or only the lower portion of the first nozzle.

Since all of the above-described components are not necessary, the treatment module 1300 may selectively include portions of the above-described components. Also, since it is unnecessary to sequentially perform the above-described processes in the described order, the process described later may be performed before the process described earlier.

Furthermore, since it is unnecessary to independently perform the above-described embodiments, the embodiments may be individually performed or performed in the combination thereof.

According to the present invention, the parasitic deposition phenomenon may be prevented in the thin film deposition process.

According to the present invention, the uniform metal oxide may be formed on the substrate.

According to the present invention, the semiconductor devices may be improved in yield and quality.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A substrate treatment apparatus, comprising:
   a process chamber;
   a support unit disposed within the process chamber to support a substrate; and
   a nozzle unit disposed within the process chamber to spray gas,
   the nozzle unit including,
   a first nozzle spraying process gas,
   a second nozzle spraying blocking gas onto an inner wall of the process chamber or an area adjacent to the support unit to prevent the process gas from being deposited on the inner wall of the process chamber or the support unit,
   at least one inner tube in which the processing gas is introduced, and
   an outer tube through which a cooling fluid for cooling the process gas within the at least one inner tube flows, the outer tube along sidewalls and a bottom surface of the at least one inner tube;
   wherein the first nozzle sprays the process as in a horizontal direction, and
   the second nozzle is disposed in at least one of upper and lower portions of the nozzle unit to spray the blocking as in a direction parallel to that of the process gas.

2. The substrate treatment apparatus of claim 1, wherein the nozzle unit further includes,
   a first inner tube in which the blocking gas is introduced; and
   a second inner tube in which the process gas is introduced, the second inner tube surrounding the first inner tube,
   wherein the outer tube surrounds the second inner tube,
   the first nozzle extends from the second inner tube toward the outer tube, and
   the second nozzle extends from the first inner tube toward the outer tube.

3. The substrate treatment apparatus of claim 1, wherein the first nozzle extends from the at least one inner tube toward the outer tube, and
   the second nozzle is disposed outside an upper end of the outer tube and in a lower end of the outer tube.

4. The substrate treatment apparatus of claim 1, wherein the first nozzle extends from the at least one inner tube toward the outer tube, and
   the second nozzle comprises a circular tube disposed along a circumference direction of an inner side surface of the outer tube and in which the blocking gas is introduced and spray holes defined in the outer tube and connected to the circular tube.

5. The substrate treatment apparatus of claim 1, wherein the support unit comprises:
   a support plate in which a plurality of holder grooves for receiving a substrate holder are arranged along an edge area of a top surface thereof, the support plate having a plate shape; and
   a rotation driving member rotating the support plate.

6. The substrate treatment apparatus of claim 5, wherein the nozzle unit is disposed above a central area of the support plate, and
   the first and second nozzles are provided in plurality to form a radial gas flow in which the gas flows from the central area of the support plate toward an edge area.

7. The substrate treatment apparatus of claim 5, wherein a second groove is defined in the central area of the top surface of the support plate, and a lower end of the nozzle unit is inserted into the second groove so that the lower end of the nozzle unit is spaced from a bottom surface of the second groove.

8. The substrate treatment apparatus of claim 1, further comprising:
a plurality of the first nozzles vertically stacked from a center of the nozzle unit toward upper or lower ends of the nozzle unit.

9. A nozzle unit, comprising:
a nozzle body including,
nozzles are arranged along an edge of the nozzle body and extend from a center of toe nozzle body to the edge of the nozzle body,
at least one inner tube in which a process gas is introduced, and
an outer tube through which a cooling fluid for cooling the process gas within the at least one inner tube flows, the outer tube along sidewalls and a bottom surface of the at least one inner tube,
the nozzle body having a cylindrical shape,
the nozzles including,
first nozzles spraying the process gas in a horizontal direction,
second nozzles disposed in upper or lower ends of the nozzle body to spray blocking gas in a horizontal direction parallel to that of the process gas.

10. The nozzle unit of claim 9, wherein the second nozzles are classified into a first group disposed in the upper end of the nozzle body and a second group disposed in the lower end of the nozzle body, and
the second nozzles belonging to the same group are provided along a circumference direction of the nozzle body at the same height of the nozzle body.

11. The nozzle unit of claim 10, wherein the second nozzles belonging to the first group spray the blocking gas onto an area adjacent to an upper wall of a process chamber in which the nozzle unit is installed, and
the second nozzles belonging to the second group spray the blocking gas onto an area adjacent to a support plate on which substrates are placed.

12. The nozzle unit of claim 9, wherein the nozzle body further includes,
a first inner tube in which the blocking gas is introduced, and
a second inner tube in which the process gas is introduced, the second inner tube surrounding the first inner tube, and
wherein the outer tube surrounds the second inner tube, the first nozzles spray the process gas within the second inner tube to the outside of the outer tube, and
the second nozzles spray the blocking gas within the first inner tube to the outside of the outer tube.

13. The nozzle unit of claim 9,
wherein the first nozzles spray the process gas within the at least one inner tube to the outside of the outer tube, and
the second nozzles are provided outside of an upper end of the outer tube and in a lower end of the outer tube.

14. The nozzle unit of claim 9,
wherein the first nozzles spray the process gas within the at least one inner tube to the outside of the outer tube, and
the second nozzles comprise a circular tube disposed along a circumference direction of an inner side surface of the outer tube and in which the blocking gas is introduced and spray holes defined in the outer tube and connected to the circular tube.

15. The nozzle unit of claim 9, wherein the first nozzles are vertically stacked from a center of the nozzle body toward the upper or lower ends of the nozzle body.

* * * * *